(12) United States Patent
Sommer

(10) Patent No.: US 7,924,585 B2
(45) Date of Patent: Apr. 12, 2011

(54) PULSE RESISTOR (BRAKE RESISTOR) FOR A FREQUENCY CONVERTER IN THE HIGHER VOLTAGE AND CAPACITY RANGE

(75) Inventor: Rainer Sommer, Heroldsbach (DE)

(73) Assignee: Siemens Aktiengesellschaft, Munich (DE)

( * ) Notice: Subject to any disclaimer, the term of this patent is extended or adjusted under 35 U.S.C. 154(b) by 470 days.

(21) Appl. No.: 12/064,889

(22) PCT Filed: Jul. 28, 2006

(86) PCT No.: PCT/EP2006/064786
§ 371 (c)(1),
(2), (4) Date: Feb. 26, 2008

(87) PCT Pub. No.: WO2007/023061
PCT Pub. Date: Mar. 1, 2007

(65) Prior Publication Data
US 2008/0197966 A1 Aug. 21, 2008

(30) Foreign Application Priority Data
Aug. 26, 2005 (DE) .......................... 10 2005 040 549

(51) Int. Cl.
*H02M 3/24* (2006.01)
*H02M 7/46* (2006.01)

(52) U.S. Cl. ............................ 363/99; 363/120; 363/132
(58) Field of Classification Search .................. 363/29, 363/70, 71, 98, 99, 120, 132, 151
See application file for complete search history.

(56) References Cited

U.S. PATENT DOCUMENTS

| | | | | |
|---|---|---|---|---|
| 5,034,669 | A * | 7/1991 | Sako et al. | 318/376 |
| 5,874,818 | A * | 2/1999 | Schuurman | 318/400.04 |
| 5,936,855 | A * | 8/1999 | Salmon | 363/46 |
| 6,301,137 | B1 * | 10/2001 | Li | 363/98 |
| 7,075,267 | B1 * | 7/2006 | Cheng | 318/807 |

FOREIGN PATENT DOCUMENTS

| | | |
|---|---|---|
| DE | 101 03 031 A1 | 7/2002 |
| JP | 62 277081 A | 12/1987 |

* cited by examiner

*Primary Examiner* — Jessica Han
(74) *Attorney, Agent, or Firm* — Henry M. Feiereisen; Ursula B. Day

(57) ABSTRACT

The invention relates to a pulse resistor for a frequency converter in the higher voltage and capacity range. The inventive pulse resistor is characterized by comprising at least two bipolar subsystems (24) and a resistor element (14), said subsystems (24) and said resistor element (14) being connected in series. The inventive pulse resistor is devoid of the drawbacks of known pulse resistors, it can be finely controlled by a brake current ($i_B$) and can be adapted to any medium voltage by simple means.

8 Claims, 4 Drawing Sheets

PULSE RESISTOR (BRAKE RESISTOR) FOR A FREQUENCY CONVERTER IN THE HIGHER VOLTAGE AND CAPACITY RANGE

BACKGROUND OF THE INVENTION

The invention relates to a pulse resistor for a converter in the moderately high voltage and power range.

Converters having a DC voltage input are increasingly being used for regulated electrical drives and power supply installations in the moderately high voltage ranges. A converter of this type is also known as a voltage-source inverter. The standardized medium voltages 2.3 kV, 3.3 kV, 4.16 kV and 6.9 kV are counted as moderately high voltages.

FIG. 1 shows an equivalent circuit of a voltage-source inverter known from the prior art, of which just one load-side three-phase converter 2 is shown for reasons of clarity. Owing to the high voltage range, the converter valves T1-T6 of this load-side three-phase converter 2 each comprise a plurality of turn-off capable semiconductor switches 4 electrically connected in series, across each of which is connected a diode 6 in antiparallel. As each converter valve T1-T6 has three turn-off capable semiconductor switches 4, this converter topology is also called an on-off converter having a series connection number of Three. Every two converter valves T1,T2 and T3,T4 and T5,T6 respectively form a bridge path 8, which constitutes a phase module of the on-off converter 2. Each junction 10 between two converter valves T1,T2 or T3,T4 or T5,T6 forms a terminal L1 or L2 or L3 respectively for connecting a three-phase load, for example a three-phase motor. The three phase modules 8 of the three-phase converter 2 are electrically connected in parallel by two busbars $P_0$ and $N_0$. A DC-link circuit capacitor $C_{ZW}$ is connected between these two busbars $P_0$ and $N_0$, said capacitor comprising, for example, one or a plurality of capacitors electrically connected in series and/or parallel. A DC voltage $U_d$ lies across this DC-link circuit capacitor $C_{ZW}$. In this equivalent circuit of an on-off converter having a series connection number of Three, insulated gate bipolar transistors (IGBT) are provided as the turn-off capable semiconductor switches 4. The series connection number depends on the DC voltage $U_d$ lying across DC-link circuit capacitor $C_{ZW}$ and on the blocking ability of commercially available IGBTs.

With temporary energy recovery in the DC-link circuit capacitor $C_{ZW}$, the DC voltage $U_d$ lying across the DC-link circuit capacitor $C_{ZW}$ can increase such that it exceeds a maximum permissible value for this DC voltage. Such a situation occurs in particular during braking of a three-phase motor connected to the terminals L1, L2 and L3. Other causes that are generally of short duration, such as rapid fluctuations of the line voltage of a grid supply or load fluctuations, can also produce such overvoltages. The following measures are known for overcoming these problems:

Connecting a converter with an energy-recovery facility, the converter being electrically connected in parallel with the DC-link circuit capacitor $C_{ZW}$. The excess energy from the DC-link circuit capacitor $C_{ZW}$ can thereby be fed back into a grid system that is able to receive power.

Connecting a pulse-controlled resistor across the busbars $P_0, N_0$ of the DC-link circuit, said resistor being used to convert the excess energy of the DC-link circuit capacitor $C_{ZW}$ into heat.

FIG. 2 shows an equivalent circuit of a pulse-controlled resistor, also known as a pulse resistor. This known pulse resistor comprises a final control element 12 and a resistance element 14. A phase module 8 is used as the final control element 12, for which the turn-off capable semiconductor switches 4 of the lower converter valve T8 are not needed. The implementation of the upper converter valve T7 of this phase module 8 is the same as the implementation of the converter valve T1 or T3 or T5 respectively of the load-side three-phase converter 2 shown in FIG. 1. To aid understanding, the turn-off capable semiconductor switches 4 of the lower converter valve T8 of the final control element 12 of the pulse resistor are not shown explicitly in the equivalent circuit diagram. These can, however, be present in the phase module 8, but are not actuated with the "brake" function. The resistance element 14 is electrically connected in parallel with the lower converter valve T8 having the series connection number of Three. This resistance element 14 comprises a resistive and an inductive component 16 and 18. The inductive component 18 represents its parasitic inductance. This pulse resistor has the following disadvantages for high voltages:

a) The currents $i_P$ and $i_N$ in the supply lines 20 and 22 of the pulse resistor have a very high rate of current rise di/dt, resulting in emission of electromagnetic interference.

b) The supply lines 20 and 22 must be made physically short and of low inductance in order to limit the voltages arising across the turn-off capable semiconductor switches 4.

c) This pulse resistor has an on-off response and in the periodic pulsed operation generates a high AC component of the current $i_P$ and $i_N$ in the supply lines 20 and 22.

d) In order to perform its function, this pulse resistor requires a DC capacitor $C_{ZW}$ to be physically located as close as possible, i.e. this pulse resistor must be physically positioned immediately beside the DC-link circuit capacitor $C_{ZW}$.

The disadvantages of points a) and b) are particularly troublesome if the pulse-controlled resistor 14 is to be used as an optional add-on to the converter 2. The disadvantage stated in point c) results in increased ripple on the DC voltage $U_d$ of the DC-link circuit capacitor $C_{ZW}$ of the one-off converter 2 having the series connection number of Three. This increased ripple has unwanted repercussions for the operation of other converters connected to the busbars $P_0, N_0$. The disadvantage stated in point d) means that this pulse resistor cannot be used with converter topologies that do not comprise a DC-link circuit capacitor $C_{ZW}$.

SUMMARY OF THE INVENTION

Hence the object of the invention is to define a pulse resistor that no longer has the stated disadvantages.

This object is achieved according to the invention by a pulse resistor for a converter in the moderately high voltage and power range having at least two two-terminal subsystems and a resistance element, these subsystems and the resistance element being electrically connected in series.

The fact that at least two two-terminal subsystems are now used instead of turn-off capable semiconductor switches means that the resistance element of the pulse resistor can be connected directly in series with the subsystems that are electrically connected in series. The degree of fine-control of a braking current can be defined by the choice of the number of subsystems. Since the two-terminal subsystems each have a unipolar storage capacitor, this pulse resistor according to the invention no longer needs a DC capacitor. Hence this also removes the condition that this pulse resistor must be physically positioned immediately beside a DC-link circuit capacitor or a load-side converter, i.e. this pulse resistor according to the invention can be connected by two supply lines, for example stranded wires, to a positive and a negative busbar of a load-side converter.

Incremental control of a braking current is achieved by switching in and out subsystems of the pulse resistor according to the invention, i.e. the pulse resistor according to the invention no longer has an on-off response. As a result, high AC current components no longer arise in the supply lines of the pulse resistor.

In an advantageous embodiment of the pulse resistor, the storage capacitors of the subsystems that are electrically connected in series are designed to be of such a capacitance that an amount of energy stored in parasitic inductances of the supply lines and of the resistance element is small compared with an amount of energy stored in these storage capacitors. This minimizes an overvoltage that results when a braking current is switched off. This condition is achieved by the storage capacitors being designed to have a sufficiently large capacitance.

In another advantageous embodiment of the pulse resistor, the storage capacitors of the subsystems that are electrically connected in series are designed to be of such a capacitance that the time constant formed from the resistance element and storage capacitors is small compared with the period of each control state of the subsystems. This prevents, during each switching operation, any unnecessary fluctuation in the voltages across the unipolar storage capacitors of the subsystems that are electrically connected in series. This condition is likewise satisfied by storage capacitors having a sufficiently large capacitance.

BRIEF DESCRIPTION OF THE DRAWING

The invention is explained in greater detail with reference to the drawing, which shows schematically an embodiment of a pulse resistor according to the invention.

DETAILED DESCRIPTION OF PREFERRED EMBODIMENTS

Figure 1:
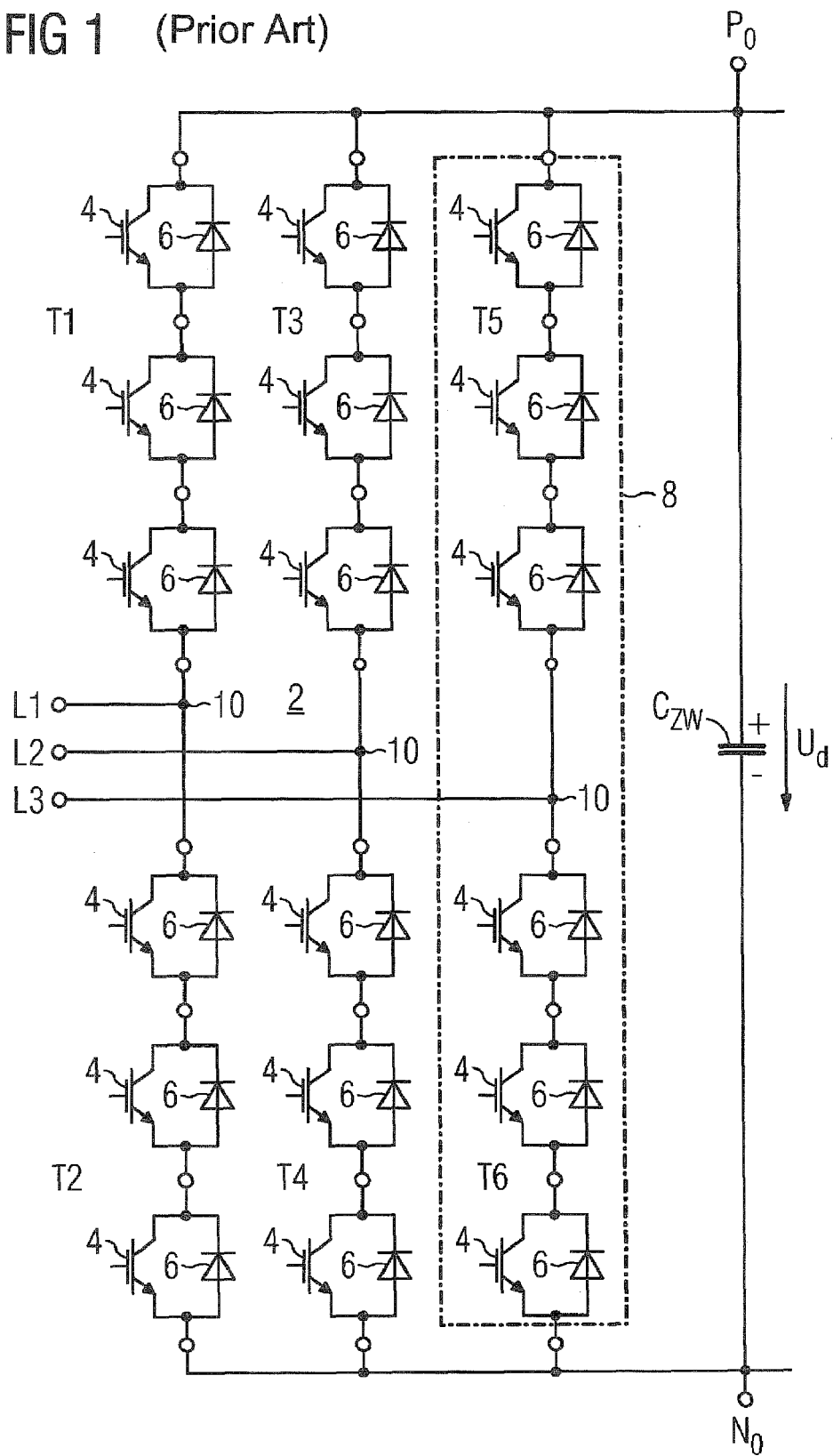
FIG. 1 shows an equivalent circuit of a load-side converter of a voltage-source inverter known from the prior art.
Figure 2:
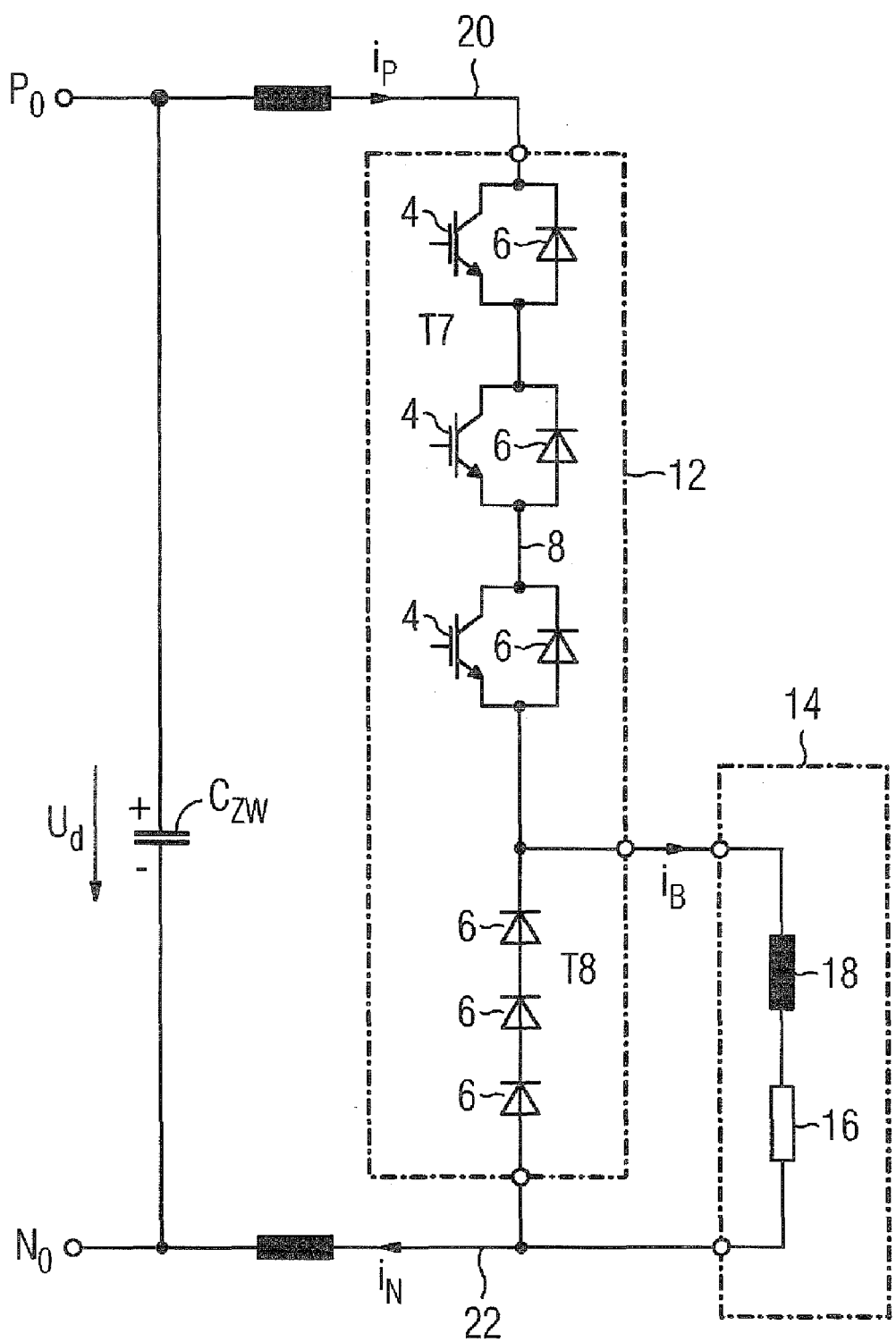
FIG. 2 shows an equivalent circuit of a known pulse-controlled resistor.
Figure 3:
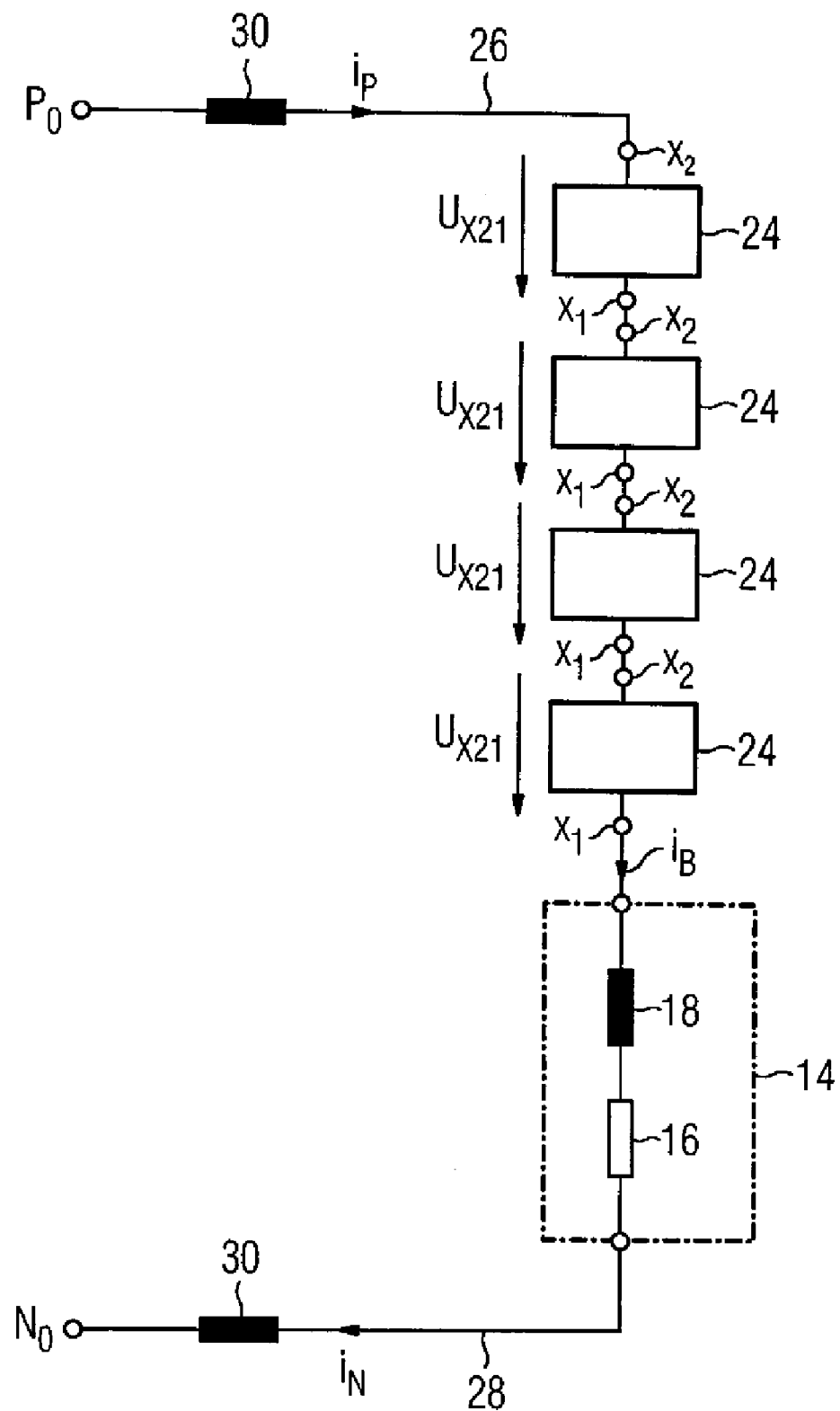
FIG. 3 shows an equivalent circuit of a pulse resistor according to the invention, and FIGS. 4 and 5 each show a circuit arrangement of a subsystem.

As shown in the equivalent circuit of the pulse resistor according to the invention shown in FIG. 3, four subsystems 24 and a resistance element 14 are electrically connected in series. The number of subsystems 24 is shown by way of example in this diagram, i.e. there can be any number of subsystems 24 electrically connected in series. For example, the requirement for a degree of fine-control of a braking current $i_B$ determines the number of subsystems 24 used. This pulse resistor is electrically conductively connected by a supply line 26 and 28 to a busbar $P_0$ and $N_0$ of a load-side converter 2. Specific requirements placed on the supply lines 20 and 22 of the known pulse resistor shown in FIG. 2 are not placed on these supply lines 26 and 28 in the pulse resistor according to the invention.

In order to control the braking current $i_B$, only the individual subsystems 24 need to be switched in or out, said subsystems being all switched in or out simultaneously or switched in or out successively. In the idle state, when the braking current $i_B$ is zero, all the subsystems 24 are in a control state in which the terminal voltages $U_{X21}$ of the subsystems 24 each assume values that differ from zero irrespective of the direction of the terminal current, and each subsystem 24 receives or releases energy depending on the direction of the terminal current. This control state is denoted by control state II in DE 101 03 031 A1. In order to produce the maximum braking current $i_{Bmax}$, all the subsystems are driven in one control state in which the terminal voltages $U_{X21}$ of the subsystems 24 each assume the value zero irrespective of the direction of the terminal current. This control state is denoted as control state I in DE 101 03 031 A1. In order to produce finely graded intermediate values of the braking current $(0<i_B<i_{Bmax})$, in n subsystems 24 only one to n-1 subsystems 24 are switched in control state I. The remaining subsystems 24 are left in control state II. In accordance with the method disclosed in DE 101 03 031 A1 for balancing the voltages $U_C$ lying across the storage capacitors 40 of the n subsystems 24, within a series connection of n subsystems 24, the subsystems 24 having the highest capacitor voltages $U_C$ are each preferably switched into the control state I.

In order to prevent these capacitor voltages $U_C$ fluctuating during the switching operations to an unnecessarily high degree, it is advantageous and practical to choose the period of each control state to be small with respect to the time constant formed from the resistive resistance element 14 and the storage capacitors 40 of the n subsystems 24. This is achieved by storage capacitors 40 of the n subsystems 24 having sufficiently large capacitance. A second option is to select the switching frequency to be sufficiently high.

In order to minimize an overvoltage of the storage capacitors 40 of the n subsystems 24 that results when the braking current is switched off, it must be attempted to keep the energy stored in the parasitic inductances 30 and 18 of the supply lines 26, 28 and of the resistance element 14 small with respect to the energy stored in the storage capacitors 40 of the n subsystems 24. This can always be achieved by designing the storage capacitors 40 of the n subsystems 24 to have a sufficiently large capacitance.

Figure 4:
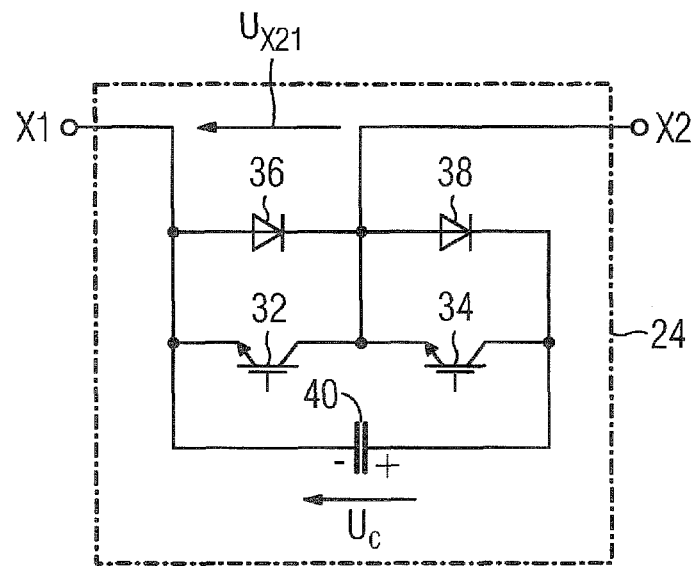
Figure 5:
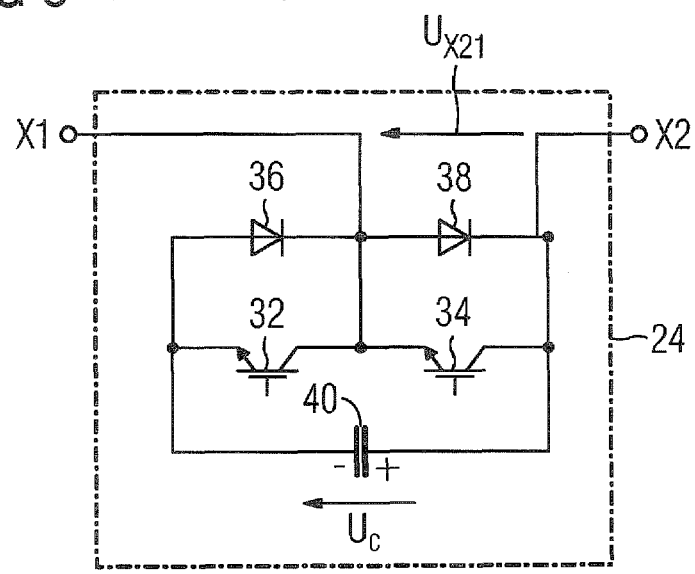

FIG. 4 shows a simple circuit arrangement disclosed in DE 101 03 031 A1 for the subsystem 24 of the pulse resistor shown in FIG. 3. The circuit arrangement shown in FIG. 5 represents a variant that is fully identical in function. This known two-terminal subsystem 24 comprises two turn-off capable semiconductor switches 32 and 34, two diodes 36 and 38 and a unipolar storage capacitor 40. The two turn-off capable semiconductor switches 32 and 34 are electrically connected in series, with this series circuit being electrically connected in parallel with the storage capacitor 40. One of the two diodes 36 and 38 is electrically connected in parallel with each turn-off capable semiconductor switch 32 and 34 in such a way that this diode are connected in antiparallel with the corresponding turn-off capable semiconductor switch 32 or 34. The unipolar storage capacitor 40 of the subsystem 24 is composed of either one capacitor or a capacitor bank containing a plurality of such capacitors having a resultant capacitance $C_0$. The junction between the emitter of the turn-off capable semiconductor switch 32 and the anode of the diode 36 forms a connecting terminal X1 of the subsystem 24. The junction between the two turn-off capable semiconductor switches 32 and 34 and the two diodes 36 and 38 form a second connecting terminal X2 of the subsystem 24.

In the embodiment of the subsystem 24 shown in FIG. 5, this junction forms the first connecting terminal X1. The junction between the drain of the turn-off capable semiconductor switch 34 and the cathode of the diode 38 forms the second connecting terminal X2 of the subsystem 24.

In control state I, the turn-off capable semiconductor switch 32 is switched on, and the turn-off capable semiconductor switch 34 is switched off. In order to obtain control state II, the turn-off capable semiconductor switch 32 is switched off and the turn-off capable semiconductor switch 34 is switched on. In control state I, the terminal voltage $U_{X21}$ of the system 24 equals zero, whereas in control state II, the terminal voltage $U_{X21}$ equals the capacitor voltage $U_C$ lying across the storage capacitor 40.

By selecting the number of subsystems 24 that are electrically connected in series of the pulse resistor shown in FIG. 3, this pulse resistor according to the invention can be adjusted by simple means to suit any standardized medium voltage. Likewise, the choice of the number of subsystems 24 of the pulse resistor shown in FIG. 3 predetermines the capacitor voltage $U_C$ lying across each storage capacitor 40. This capacitor voltage $U_C$ also defines the withstand voltage of the two turn-off capable semiconductor switches 32 and 34. As shown in FIGS. 4 and 5, insulated gate bipolar transistors (IGBT) are used as the turn-off capable semiconductor switches 32 and 34. MOS field effect transistors, also known as MOSFETs, can also be used.

All the aforementioned disadvantages a) to d) can be avoided by this pulse resistor according to the invention. This pulse resistor according to the invention additionally has the following advantages:

A fine degree of control of a braking current $i_B$ in a plurality of intermediate levels equal to the number of the series-connected subsystems 24.

Standardized implementation using the subsystems disclosed in DE 101 03 031 A1.

The sum total of these properties justifies the larger number of components, in particular for converters in the moderately high voltage and power range.

What is claimed is:

1. A pulse resistor for a converter operating in a moderately high voltage and power range, comprising:
    at least two serially connected two-terminal subsystems, said serially connected subsystems having a first terminal connected to a first busbar and a second terminal; and
    a substantially ohmic resistance element electrically connected in series with the serially connected subsystems, with a first terminal of the resistance element connected to a second busbar and a second terminal of the resistance element connected to the second terminal of the serially connected subsystems,
    wherein current flow between the first busbar and the second busbar is exclusive through the serially connected subsystems and the resistance element.

2. The pulse resistor of claim 1, wherein the two-terminal subsystem comprises two serially connected turn-off semiconductor switches, a unipolar storage capacitor connected in parallel with the serially connected turn-off semiconductor switches, and two diodes, with each of the two diodes being connected antiparallel with a corresponding one of the turn-off semiconductor switches.

3. The pulse resistor of claim 2, wherein the unipolar storage capacitor has a capacitance value selected such that an amount of energy stored in parasitic inductances of supply lines and of the resistance element is substantially smaller than an amount of energy stored in the unipolar storage capacitor.

4. The pulse resistor of claim 2, wherein the unipolar storage capacitor of the two-terminal subsystem has a capacitance value selected such that a time constant defined by the resistance element and the unipolar storage capacitor is smaller than a duration of a control state.

5. The pulse resistor of claim 2, wherein each subsystem includes two connecting terminals, with one of the two serially connected turn-off semiconductor switches connected to both connecting terminals.

6. The pulse resistor of claim 2, wherein each subsystem includes two connecting terminals, with one the connecting terminals connected to a center tap of the serially connected turn-off semiconductor switches and the other one of the connecting terminals connected to an end tap of the serially connected turn-off semiconductor switches.

7. The pulse resistor of claim 1, wherein the turn-off semiconductor switches are implemented as insulated gate bipolar transistors.

8. The pulse resistor of claim 1, wherein the turn-off semiconductor switches are implemented as MOS field effect transistors.

* * * * *